United States Patent
Hamaguchi et al.

(10) Patent No.: US 11,800,656 B2
(45) Date of Patent: *Oct. 24, 2023

(54) ELECTRONIC DEVICE HOUSING

(71) Applicant: TORAY INDUSTRIES, INC., Tokyo (JP)

(72) Inventors: Mitsushige Hamaguchi, Iyo-gun (JP); Takashi Fujioka, Iyo-gun (JP); Masato Honma, Iyo-gun (JP)

(73) Assignee: TORAY INDUSTRIES, INC., Tokyo (JP)

( * ) Notice: Subject to any disclaimer, the term of this patent is extended or adjusted under 35 U.S.C. 154(b) by 618 days.

This patent is subject to a terminal disclaimer.

(21) Appl. No.: 16/325,342

(22) PCT Filed: Sep. 25, 2017

(86) PCT No.: PCT/JP2017/034456
§ 371 (c)(1),
(2) Date: Feb. 13, 2019

(87) PCT Pub. No.: WO2018/056434
PCT Pub. Date: Mar. 29, 2018

(65) Prior Publication Data
US 2019/0208654 A1  Jul. 4, 2019

(30) Foreign Application Priority Data

Sep. 26, 2016 (JP) .................................. 2016-186529
Sep. 26, 2016 (JP) .................................. 2016-186530

(51) Int. Cl.
*H05K 5/02* (2006.01)
*B32B 5/28* (2006.01)
(Continued)

(52) U.S. Cl.
CPC .............. *H05K 5/0217* (2013.01); *B29B 7/90* (2013.01); *B29B 9/06* (2013.01); *B29B 9/14* (2013.01);
(Continued)

(58) Field of Classification Search
CPC ..... B29B 7/90; B29C 45/14336; B29C 70/08; B29C 70/16; B29K 2063/00;
(Continued)

(56) References Cited

U.S. PATENT DOCUMENTS

2006/0110599 A1   5/2006   Honma et al.
2009/0208721 A1*  8/2009   Tsuchiya ............... B29C 70/086
                                                              264/250

FOREIGN PATENT DOCUMENTS

JP      2006-44260 A      2/2006
JP      2010-254276 A     11/2010
WO      WO 2004/060658 A1  7/2004

OTHER PUBLICATIONS

Machine Translation of JP 2010-254276 (Year: 2010).*
(Continued)

*Primary Examiner* — Sathavaram I Reddy
(74) *Attorney, Agent, or Firm* — Birch, Stewart, Kolasch & Birch, LLP

(57) ABSTRACT

The invention aims to provide an electronic device housing that can maintain the antenna performance without deteriorating the radio communication performance, ensures uniform characteristics as one molded electronic device housing in spite of consisting of a plurality of members, and show excellent features in terms of the degree of warpage and dimensional accuracy as well as small deformation in high temperature environments and high mass productivity. The electronic device housing consists mainly of a fiber reinforcing member (a) and a fiber reinforcing member (b), the
(Continued)

fiber reinforcing member (a) containing a resin (a1) and a fiber (a2), the fiber reinforcing member (b) containing a resin (b1) and a fiber (b2), the fiber reinforcing member (a) and the fiber reinforcing member (b) being joined directly without the existence of another layer at the joining face between the fiber reinforcing member (a) and the fiber reinforcing member (b), and the fiber reinforcing member (a) and the fiber reinforcing member (b) fulfilling a specific relation in terms of linear expansion coefficient and/or bending elastic modulus.

4 Claims, 3 Drawing Sheets

(51) Int. Cl.

| | |
|---|---|
| B29B 7/90 | (2006.01) |
| B29B 9/06 | (2006.01) |
| B29B 9/14 | (2006.01) |
| B29C 45/14 | (2006.01) |
| B32B 5/02 | (2006.01) |
| B32B 27/12 | (2006.01) |
| B32B 27/20 | (2006.01) |
| B29K 63/00 | (2006.01) |
| B29L 31/34 | (2006.01) |

(52) U.S. Cl.
CPC ........ *B29C 45/14336* (2013.01); *B32B 5/022* (2013.01); *B32B 5/28* (2013.01); *B32B 27/12* (2013.01); *B32B 27/20* (2013.01); *B29K 2063/00* (2013.01); *B29K 2713/00* (2013.01); *B29L 2031/34* (2013.01); *B32B 2457/00* (2013.01)

(58) Field of Classification Search
CPC ............ B29K 2101/10; B29K 2713/00; B29K 2995/0003; B29K 2995/0005; B29L 2031/34; B32B 5/022; B32B 5/28; B32B 27/12; B32B 27/20; B32B 2457/00; H05K 5/0217; H05K 9/009
See application file for complete search history.

(56) References Cited

OTHER PUBLICATIONS

Machine Translation of JP 2006-044260 (Year: 2006).*
International Search Report, issued in PCT/JP2017/034456, PCT/ISA/210, dated Dec. 26, 2017.
Written Opinion of the International Searching Authority, issued in PCT/JP2017/034456, PCT/ISA/237, dated Dec. 26, 2017.

* cited by examiner

[Fig. 1]
(i)
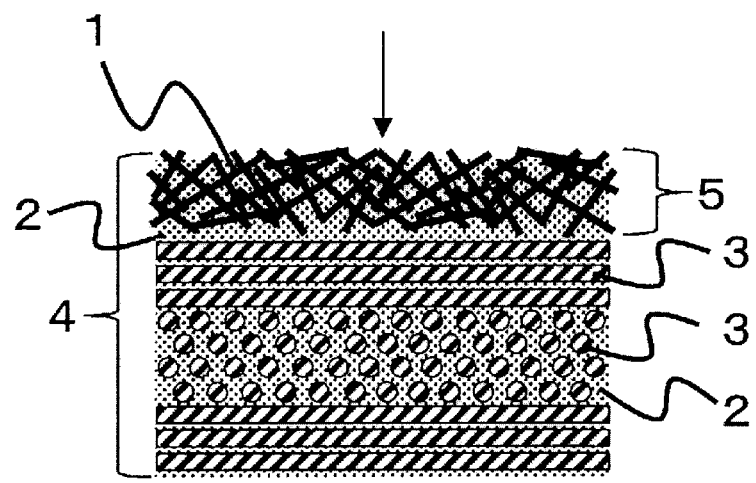
(ii)
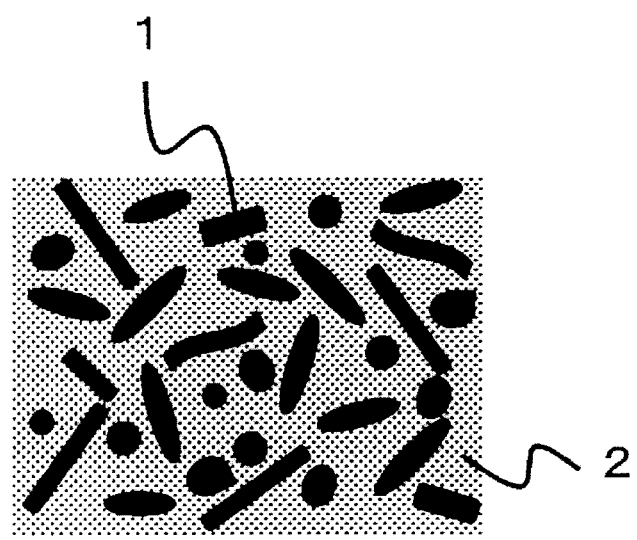

[Fig. 2]
(i)
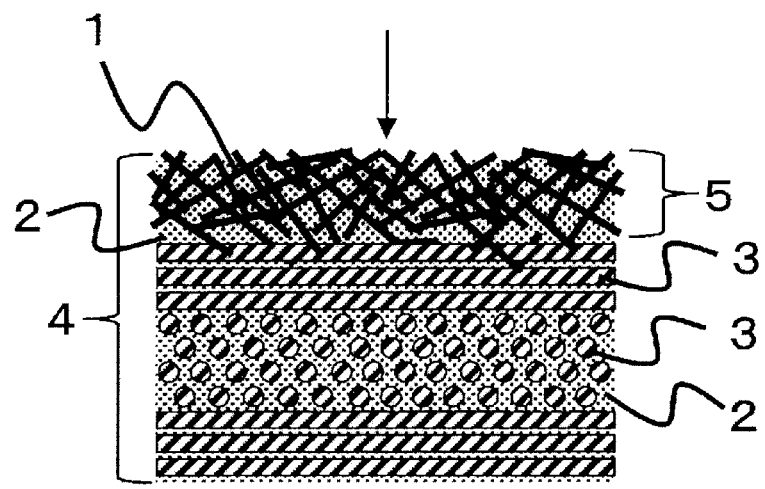
(ii)
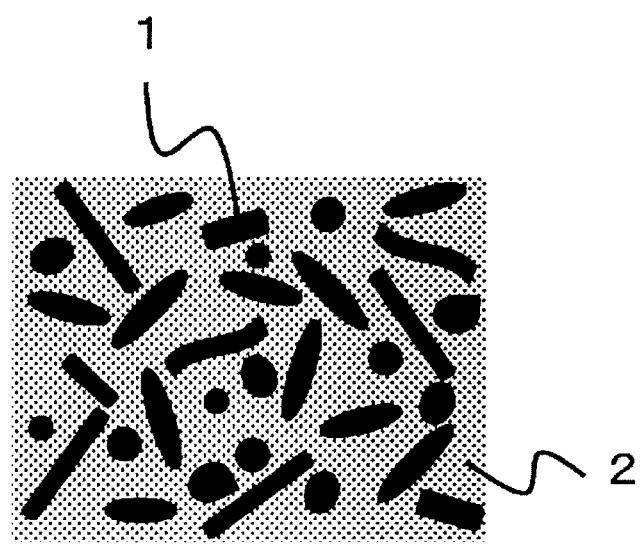

[Fig. 3]
(i)
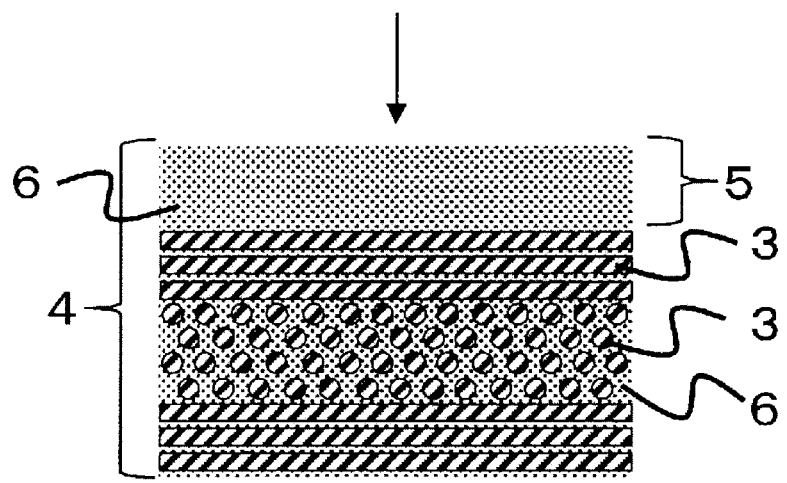
(ii)
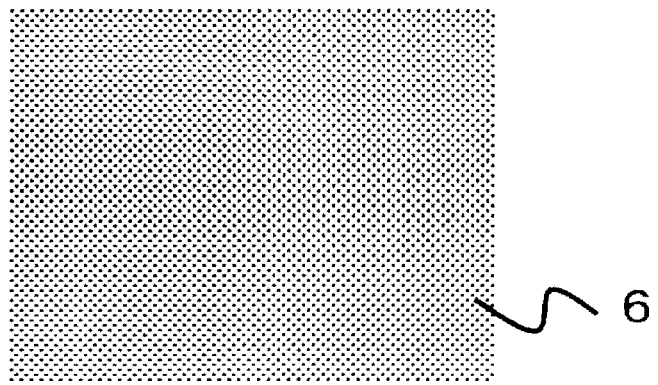

ELECTRONIC DEVICE HOUSING

TECHNICAL FIELD

The present invention relates to an electronic device housing that consists mainly of a fiber reinforcing member (a) and a fiber reinforcing member (b), can maintain the antenna performance without deteriorating the radio communication performance, ensures uniform characteristics as one molded electronic device housing in spite of consisting of a plurality of members, and shows excellent features in terms of the degree of warpage and dimensional accuracy as well as small deformation in high temperature environments and high mass productivity.

BACKGROUND ART

Fiber reinforced composite materials are excellent in mechanical properties and light in weight, and have been widely used in members of aircraft, automobiles, and the like. In recent years, fiber reinforced composite materials have been used in relatively small and complicate shaped parts of, for example, electric/electronic devices, office automation devices, household electric appliances, medical devices, etc., which are required to be thin, light in weight, and rigid. As electrical and electronic devices with higher performance are developed, there have been increasing demands for high quality members of these devices, housings in particular, that have radio wave shielding capability for prevention of malfunction, high strength and high rigidity for weight reduction, and thin walls. Furthermore, products with radio communication functions are now in wider use, and there are demands for molded articles that have radio wave shielding capability in addition to radio communication functions.

Patent document 1 discloses a method in which a resin sheet and a fiber reinforcing resin sheet are used in combination for manufacturing a fiber reinforced plastic molded article having both a radio wave transmitting part and an electromagnetic wave shielding part.

Patent document 2 discloses a housing for an electric/electronic device characterized by a layered structure that includes a first layer made of FRP containing carbon fiber as reinforcing material and a second layer made of a resin or a resin containing reinforcing short fibers.

PRIOR ART DOCUMENTS

Patent Documents

Patent document 1: Japanese Unexamined Patent Publication (Kokai) No. 2014-148111
Patent document 2: Japanese Unexamined Patent Publication (Kokai) No. HEI-9-46082

SUMMARY OF INVENTION

Problems to be Solved by the Invention

For the invention described in Patent document 1, however, resin sheets that provide a radio wave transmitting part and serve as an antenna and fiber reinforced plastic sheets that provide an electromagnetic wave shielding part have to be stacked in a complicated manner, and further improvement is required to increase the mass productivity. The electronic device housing disclosed in Patent document 2, furthermore, is a housing for electric/electronic instruments composed mainly of a first layer of molded FRP and a second layer of resin containing reinforcing short fibers, and the two layers are integrated using an adhesive, but further improvement is required to realize weight reduction and mass productivity enhancement. Furthermore, these disclosed techniques are intended to construct a housing by combining a plurality of members having different characteristics, and therefore, differences in characteristics among these members lead to moldings suffering from strain and modification, resulting in failure in developing sufficiently good characteristics.

Thus, an object of the present invention is to provide an electronic device housing that can maintain the antenna performance without deteriorating the radio communication performance, ensures uniform characteristics as one molded electronic device housing in spite of consisting of a plurality of members to develop radio wave shielding capability as well, and show excellent features in terms of the degree of warpage and dimensional accuracy as well as small deformation in high temperature environments and high mass productivity.

Means of Solving the Problems

The present invention, which aims at solving the above problems, is as described below.

(1) An electronic device housing including a fiber reinforcing member (a) and a fiber reinforcing member (b),
the fiber reinforcing member (a) containing a resin (a1) and a fiber (a2),
the fiber reinforcing member (b) containing a resin (b1) and a fiber (b2),
the fiber reinforcing member (a) and the fiber reinforcing member (b) being joined directly without the existence of another layer at the joining face between the fiber reinforcing member (a) and the fiber reinforcing member (b), and the fiber reinforcing members (a) and (b) meeting equations (1) and/or (2):

$$0.5 < A1/B1 < 3 \qquad \text{equation (1)}$$

A1: linear expansion coefficient of the fiber reinforcing member (a)
B1: linear expansion coefficient of the fiber reinforcing member (b)

$$0.7 < A2/B2 < 1.2 \qquad \text{equation (2)}$$

A2: bending elastic modulus of the fiber reinforcing member (a)
B2: bending elastic modulus of the fiber reinforcing member (b)

Advantageous Effects of the Invention

The present invention can provide an electronic device housing that can maintain the antenna performance without deteriorating the radio communication performance, ensures uniform characteristics as one molded electronic device housing in spite of consisting of a plurality of members, and show excellent features in terms of the degree of warpage and dimensional accuracy as well as small deformation in high temperature environments and high mass productivity.

BRIEF DESCRIPTION OF THE DRAWINGS

FIG. 1 gives schematic diagrams of a typical fiber reinforcing member (b), wherein diagram (i) shows a cross section and diagram (ii) shows a surface observed from the direction of the arrow.

FIG. 2 gives schematic diagrams of another typical fiber reinforcing member (b), wherein diagram (i) shows a cross section and diagram (ii) shows a surface observed from the direction of the arrow.

FIG. 3 gives schematic diagrams of still another typical fiber reinforcing member (b), wherein diagram (i) shows a cross section and diagram (ii) shows a surface observed from the direction of the arrow.

DESCRIPTION OF PREFERRED EMBODIMENTS

A preferred embodiment of the present invention is described below.

The electronic device housing according to the present invention is one composed mainly of a fiber reinforcing member (a) and a fiber reinforcing member (b).

It is necessary for the electronic device housing according to the present invention to meet equations (1) and/or (2):

$$0.5 < A1/B1 < 3 \qquad \text{equation (1)}$$

A1: linear expansion coefficient of the fiber reinforcing member (a)

B1: linear expansion coefficient of the fiber reinforcing member (b)

Here, the linear expansion coefficient of the fiber reinforcing member (a) or the fiber reinforcing member (b) can be determined by taking a test piece with a predetermined size from each member of the electronic device housing and heating it in a nitrogen atmosphere at a heating rate of 5° C./min while taking measurements in the rage of 30° C. to 150° C. according to the method specified in JIS K7197 (2012). Equation (1) specifies the ratio between the linear expansion coefficient of the fiber reinforcing member (a) and that of the fiber reinforcing member (b), and if equation (1) is met in the production of an electronic device housing composed of a plurality of members, it ensures the prevention of the generation of strain and deformation resulting from the difference in shrinkage between the members, leading to an electronic device housing having a low degree of warpage and high dimensional accuracy.

$$0.7 < A2/B2 < 1.2 \qquad \text{equation (2)}$$

A2: bending elastic modulus of the fiber reinforcing member (a)

B2: bending elastic modulus of the fiber reinforcing member (b)

Here, the bending elastic modulus of the fiber reinforcing member (a) or the fiber reinforcing member (b) can be determined by taking a test piece with a predetermined size from each member of the electronic device housing and performing a bending test under the conditions of 23° C. according to the method specified in ASTM D790-10. Equation (2) specifies the ratio between the elastic modulus of the fiber reinforcing member (a) and that of the fiber reinforcing member (b), and if equation (2) is met in the production of an electronic device housing composed of a plurality of members or in its use environment, it ensures the prevention of the generation of strain and deformation, leading to an electronic device housing having a low degree of warpage, high dimensional accuracy, and high falling shock resistance.

The electronic device housing according to the present invention has a structure (directly integrated structure) in which the fiber reinforcing member (a) and the fiber reinforcing member (b) are joined directly without the existence of another layer at the joining face between the fiber reinforcing member (a) and the fiber reinforcing member (b). This indicates that for adhering the fiber reinforcing member (a) and the fiber reinforcing member (b) together, no means other than the members exists at the joining face between the fiber reinforcing member (a) and the fiber reinforcing member (b).

There are no specific limitations on the method to use to form a structure in which the fiber reinforcing member (a) and the fiber reinforcing member (b) are joined directly, or integrated directly, and good examples include insert molding, heat welding, and ultrasonic welding. From the viewpoint of mass productivity and adhesive strength, it is preferable to adopt an insert molding process which includes a first step for inserting the fiber reinforcing member (b) into a die and a second step for injecting a resin composition containing a resin (a1) and a fiber (a2) into the inserted fiber reinforcing member (b) existing in the die to form a fiber reinforcing member (a) so that the fiber reinforcing member (a) and the fiber reinforcing member (b) are integrated.

The fiber reinforcing member (a) and the fiber reinforcing member (b) are integrated directly and firmly in the electronic device housing according to the present invention and no adhesive layer is necessary at the interface, serving to realize simplified production steps (no need of steps for removing adhesive material that is squeezed out in the adhesive coating step, processing step, etc.) and manufacture of lightweight housings.

The fiber reinforcing member (a) used for the present invention contains a resin (a1) and a fiber (a2).

There are no specific limitations on the resin (a1) to use for the present invention and useful materials include thermoplastic resins and thermosetting resins. Useful thermoplastic resins for the present invention include, for example, polyolefin resins such as polyethylene and polypropylene; polyester resins such as polyethylene terephthalate, polybutylene terephthalate, polyethylene naphthalate (PEN), polybutylene naphthalate (PBN), and liquid crystal polyesters; polyamide resins such as polycaproamide (nylon 6), polyhexamethylene adipamide (nylon 66), polypentamethylene adipamide (nylon 56), polyhexamethylene sebacamide (nylon 610), polyhexamethylene dodecamide (nylon 612), polyundecane amide (nylon 11), polydodecane amide (nylon 12), polycaproamide/polyhexamethylene adipamide copolymer (nylon 6/66), polycaproamide/polyhexamethylene terephthalamide copolymer (nylon 6/6T), polyhexamethylene adipamide/polyhexamethylene terephthalamide copolymer (nylon 66/6T), polyhexamethylene adipamide/polyhexamethylene isophthalamide copolymer (nylon 66/6I), polyhexamethylene adipamide/polyhexamethylene isophthalamide/caproamide copolymer (nylon 66/6I/6), polyhexamethylene terephthalamide/polyhexamethylene isophthalamide copolymer (nylon 6T/6I), polyhexamethylene terephthalamide/polydodecane amide copolymer (nylon 6T/12), polyhexamethylene adipamide/polyhexamethylene terephthalamide/polyhexamethylene isophthalamide copolymer (nylon 66/6T/6I), polyhexamethylene terephthalamide/poly-2-methylpentamethylene terephthalamide copolymer (nylon 6T/M5T), and polynonamethylene terephthalamide (nylon 9T); and others such as polycarbonate resin, polyphenylene sulfide (PPS) resin, polyacetal resin, polyoxymethylene resin, polyimide (PI) resin, polyamide-imide (PAI) resin, polyetherimide resin, polysulfone resin, polyether ketone (PEK) resin, polyether ether ketone (PEEK) resin, polyether ketone ketone (PEKK) resin, polytetrafluoroethylene resin, polyallylate (PAR) resin, and resins prepared by blending at least two thereof. In particular, polyolefin resin, polyester resin, polyamide resin, and PPS resin are preferable, and PPS resin is particularly preferable.

The fiber reinforcing member (a) may contain other components such as fillers and additives unless they impair the effect of the invention. Examples thereof include epoxy compound coupling agents such as carbodiimide compounds, isocyanate based compounds, organic silane based compounds, organic titanate based compounds, organic borane based compounds, bisphenol A type epoxy resins, bisphenol F type epoxy resins, bisphenol A D type epoxy resins, halogenated bisphenol A type epoxy resins, bisphenol S type epoxy resins, resorcinol type epoxy resins, hydrogenated bisphenol A type epoxy resins, aliphatic epoxy resins, phenol novolac type epoxy resins, cresol novolac type epoxy resins, naphthalene type epoxy resins, biphenyl type epoxy resins, biphenyl aralkyl type epoxy resins, dicyclopentadiene type epoxy resins, hexahydrophthalic acid glycidyl ester, dimer acid diglycidyl ether, 3,4-epoxy-6-methylcyclohexylmethyl carboxylate, 3,4-epoxycyclohexylmethyl carboxylate, other glycidyl ether type epoxy resins, other glycidyl ester type epoxy resins, and other alicyclic epoxy resins; plasticizers such as polyalkylene oxide oligomer based compounds, thioether based compounds, ester based compounds, and organic phosphorous compounds; crystal nucleating agents such as talc, kaolin, organic phosphorus compounds, and polyether ether ketone; metal soaps such as montanic acid wax based materials, lithium stearates, and aluminum stearates; mold releasing agents such as ethylene diamine-stearic acid-sebacic acid polycondensation products, silicone based compounds, and amide based compounds; color protection agents such as hypophosphite salts; and others such as lubricants, ultraviolet ray screening agents, coloring agents, flame retardants, foaming agents, and inorganic fillers including thermoplastic resins having melting points of 265° C. or less, silicates such as talc, wollastonite, zeolite, sericite, mica, kaolin, clay, pyrophyllite, bentonite, asbestos, and alumina silicate, metal compounds such as silicon oxide, magnesium oxide, alumina, zirconium oxide, titanium oxide, and iron oxide, carbonates such as calcium carbonate, magnesium carbonate, and dolomite, sulfates such as calcium sulfate, and barium sulfate, hydroxides such as calcium hydroxide, magnesium hydroxide, and aluminum hydroxide, and others such as glass beads, glass flakes, glass powder, ceramic beads, boron nitride, silicon carbide, carbon black, silica, and graphite.

For any of the above additives, the content should not exceed 20 parts by mass relative to the resin (a1), which accounts for 100 parts by mass, or the intended characteristics of the present invention may be impaired. Accordingly, the quantity of the additives contained in the fiber reinforcing member (a) should account for 10 parts by mass or less, preferably 1 part by mass or less, relative to the resin (a1), which accounts for 100 parts by mass.

The fiber (a2) to use for the present invention may be either a continuous fiber or a discontinuous fiber, but it is preferably a discontinuous fiber. Examples of the fiber (a2) include generally used reinforcing fibers such as glass fiber, polyacrylonitrile based, rayon based, lignin based, and pitch based carbon fibers (including graphite fiber), potassium titanate whisker, zinc oxide whisker, calcium carbonate whisker, wollastonite whisker, aluminum borate whisker, aramid fiber, alumina fiber, silicon carbide fiber, ceramic fiber, asbestos fiber, gypsum fiber, and metal fiber, of which two or more fibers may be used in combination. In particular, it is desirable for electronic device housings to have moderate electromagnetic wave shielding capability to prevent the malfunction of the electric/electronic devices, and accordingly, the fiber (a2) to use is preferably an electrically conductive fiber such as carbon fiber and metal fiber and the fiber (a2), which is a discontinuous fiber, is preferably a carbon fiber from the viewpoint of weight reduction and mechanical characteristics.

Regarding the mass proportions of the resin (a1) and the fiber (a2) in the fiber reinforcing member (a), the fiber (a2) preferably accounts for 5 to 200 parts by mass, more preferably 10 to 100 parts by mass, and particularly preferably 20 to 60 parts by mass, relative to the quantity of the resin (a1), which accounts for 100 parts by mass, from the viewpoint of the balance among the lightweightness, dimensional accuracy, and impact characteristics of the electronic device housing.

The fiber (a2) used for the present invention is preferably surface-treated with a sizing agent from the viewpoint of improvement in the mechanical characteristics. Good sizing agents include polyfunctional epoxy resins, acrylic acid based polymers, polyhydric alcohols, and polyethylene imines, and specific examples include polyglycidyl ethers of aliphatic polyhydric alcohols such as glycerol triglycidyl ether, diglycerol polyglycidyl ether, polyglycerol polyglycidyl ether, sorbitol polyglycidyl ether, arabitol polyglycidyl ether, trimethylolpropane triglycidyl ether, and pentaerythritol polyglycidyl ether; and others such as polyacrylic acids, copolymers of acrylic acids and methacrylic acids, copolymers of acrylic acids and maleic acids, mixtures of two or more thereof, polyvinyl alcohol, glycerol, diglycerol, polyglycerol, sorbitol, arabitol, trimethylolpropane, pentaerythritol, polyethylene imines containing a larger number of amino groups in one molecule, of which glycerol triglycidyl ether, diglycerol polyglycidyl ether, and polyglycerol polyglycidyl ether are preferred for the present invention because they contain larger numbers of highly reactive epoxy groups in one molecule and also because they are high in water-solubility and easy to spread on the fiber (a2).

In molding compounds used for the present invention, it is preferable for these sizing agents to account for 0.01 to 5 parts by mass, more preferably 0.1 to 2 parts by mass, relative to the quantity of the fiber (a2), which accounts for 100 parts by mass.

For the present invention, good means of giving a sizing agent to the fiber (a2) include, for example, a method in which a sizing agent is infiltrated into the fiber (a2) using rollers and a method in which a sizing agent is atomized and sprayed on the fiber (a2). To ensure uniform deposition of a sizing agent on the fiber (a2) in these methods, it is preferable to use the sizing agent after diluting it with a solvent or control the temperature and thread tension appropriately during the treatment. Good solvents for diluting sizing agents include water, methanol, ethanol, dimethyl formamide, dimethyl acetamide, and acetone, of which water is preferable from the viewpoint of easy handling and disaster prevention. After depositing a sizing agent on the fiber (a2), these solvents are removed by heating for evaporation. When a compound that is insoluble or low in solubility in water is used as the sizing agent, it is preferable to add an emulsifier or a surface active agent to form a water dispersion. An anion based emulsifier, cation based emulsifier, nonionic based emulsifier, etc., can be used as the emulsifier or surface active agent. Among others, the use of a nonionic based emulsifier, which is low in the degree of interaction with water and low in liability to influence of the hardness of water and electrolytes, is preferable to allow the sizing agent to work effectively.

It is preferable for the fiber (a2) to have a mass average fiber length Lw of 0.4 mm or more. It is more preferable for the fiber (a2) to have a mass average fiber length Lw of 0.8 mm or more. Fibers with larger mass average fiber lengths can work more effectively in improving the strength and rigidity, and particularly effectively in improving the impact strength. It is more preferable for the fiber (a2) to have a mass average fiber length Lw of 3.0 mm or less, more preferably 1.5 mm or less. A mass average fiber length Lw in this range ensures a good balance among strength, rigidity, and processability. The fiber (a2) used in the electronic device housing according to the present invention may not be uniform in mass average fiber length over the entire surface, but may have a distribution in fiber length. The number average fiber length Ln and mass average fiber length Lw are used to represent the distribution in fiber length of the fiber (a2).

The number average fiber length Ln of the fiber (a2) is the simple average of all fiber length measurements, which depends very sensitively to fibers with short lengths. Regarding the reinforcing effect in terms of the fiber length, fibers with larger lengths have larger reinforcing effect. Fibers with larger lengths and those with shorter lengths differ in the strength of effects and therefore, it is not appropriate to treat them equally. To emphasize the reinforcing effect of the fibers with larger lengths, it is useful to apply the mass average fiber length Lw.

The ratio Lw/Ln between the mass average fiber length Lw of the fiber (a2) and its number average fiber length Ln represents the fiber length distribution. A larger value of Lw/Ln indicates that fibers with larger lengths accounts for larger proportions. The ratio Lw/Ln between the mass average fiber length Lw of the fiber (a2) and its number average fiber length Ln is preferably 1.3 to 2.0.

The number average fiber length Ln of the fiber (a2), the mass average fiber length Lw of the fiber (a2), and their ratio Lw/Ln can be determined by the procedure described below. Here, to prepare a test piece, a sample with a length of 10 mm and a width of 10 mm was cut out of a fiber reinforcing member (a) contained in an electronic device housing. This test piece is immersed for 24 hours in a solvent in which the resin (a1) is soluble, thereby dissolving the resin component. After dissolving the resin component, the test piece was observed by microscopy at a magnification of 100. In this observation, 400 fibers are selected randomly from the field of view and their fiber lengths are measured. From the measured length Li of each fiber, the number average fiber length Ln and the mass average fiber length Lw are calculated by the following equations.

Number average fiber length $Ln=(\Sigma Li)/(N)$

Here, N is the number of fibers observed (400).

Mass average fiber length $Lw=(\Sigma Li^2)/(\Sigma Li)$

The fiber reinforcing member (b) used for the present invention contains a resin (b1) and a fiber (b2).

There are no specific limitations on the resin (b1), and it may be either a thermoplastic resin or a thermosetting resin, but it is preferably a thermosetting resin from the viewpoint of the dimensional accuracy of the electronic device housing.

There are no specific limitations on the type of the thermosetting resin to use as the resin (b1), and good examples include unsaturated polyester resins, vinyl ester resins, epoxy resins, phenol (resol type) resins, urea-melamine resins, and polyimide resins, as well as copolymers thereof, modified forms thereof, and resins prepared by blending two or more thereof. Among others, the use of thermosetting resins containing epoxy resin as the primary component, which are generally high in rigidity and strength, is preferable from the viewpoint of mechanical characteristics of their moldings. Here, the primary component of a thermosetting resin referred to above means the component that accounts for 60 mass % or more of the thermosetting resin.

In addition, the fiber reinforcing member (b) may contain other fillers and additives as required for the relevant purposes etc. Examples thereof include elastomer and rubber components, inorganic fillers, flame retardants, electric conductivity developing agents, antibacterial agent, insecticides, deodorants, color protection agents, mold releasing agents, antistatic agents, plasticizers, coloring agents, pigments, dyes, foaming agents, bubble control agents, and coupling agents. The addition of a flame retardant to the fiber reinforcing member (b) is preferable because combustion resistance is developed to ensure safety in case of fire from the electric circuit etc. contained inside the electronic device housing. Useful flame retardants include phosphorus or its compounds that can develop fire retardancy such as, for example, phosphates, condensed phosphates, phosphaphenanthrene based compounds, and other phosphorus-containing compounds, as well as red phosphorus. Of these, red phosphorus is preferable because it has a large content of phosphorus atoms, which act to develop flame retardancy, and serves to reduce the flame retardant content required for ensuring an adequate fire retardant effect. Furthermore, it is also preferable to add a flame retardation assistant with the aim of enhancing the fire retardancy. Preferred examples of the flame retardation assistant include metal hydroxide based ones such as aluminum hydroxide, magnesium hydroxide, calcium hydroxide, tin hydroxide; inorganic ones such as calcium aluminate and zirconium oxide; nitrogen based ones such as melamine cyanurate; and others such as silicon based ones and phenolic ones.

There are no specific limitations on the fiber (b2), and any fiber that is generally used as reinforcing fiber may be used suitably. In particular, the fiber (b2) is preferably a non-electrically-conductive fiber, and good examples thereof include glass fiber, organic fibers such as aramid, PBO, polyphenylene sulfide, polyester, acrylic resin, nylon, and polyethylene, and inorganic fibers such as silicon carbide and silicon nitride, of which glass fiber is preferred from the viewpoint of the characteristics of the obtainable fiber reinforcing member (b). The use of a non-electrically-conductive fiber as the fiber (b2) is preferable because the portion containing the fiber reinforcing member (b) can transmit radio waves. These fibers may be subjected to surface treatment such as treatment with a coupling agent, treatment with a sizing agent, and attachment of an additive.

There are no specific limitations on the structural features of the fiber (b2), but it is preferable that the fiber (b2) is a continuous fiber. Here, the expression "constituted mainly of continuous fibers" means that most fibers contained in the fiber reinforcing member are in the form of continuous fibers with lengths of 10 mm or more and does not necessarily mean that the fibers are continuous over the entire reinforcing member, but there will be no problem if they are severed in the middle. The fiber (b2) may be in the form of, for example, fabric cloth containing woven fiber bundles or consist of filaments, braids, filament bundles, spun yarns, etc., that are paralleled in one direction. Furthermore, it may contain only one type of reinforcing fibers or may contain two or more types thereof. It is also preferable to adopt a laminated structure containing a stack of a plurality of layer-like fiber reinforcing members (b) each composed of the resin (b1) and the fiber (b2). If, for example, the fiber reinforcing member (b) is in the form of a layer containing constituent fibers paralleled in one direction, it is preferable because the anisotropy of mechanical characteristics of the layered body can be reduced by stacking such layers in such a manner that the orientation direction in the fiber (b2) slightly differs from layer to layer. Furthermore, these stacked base layers may contain only one type of resin (b1), fiber (b2), or structural feature or may contain two or more types thereof in combination.

In 100 mass % of the fiber reinforcing member (b) used for the present invention, the mass content of the fiber (b2) is preferably 20 to 70 mass %, more preferably 25 to 70 mass %, and particularly preferably 30 to 65 mass %. When the mass content of the fiber (b2) is in the above range, it serves to enhance the dimensional accuracy, which represents an advantageous effect of the invention.

In the case of a laminated structure containing two or more layer-like fiber reinforcing members (b) as described above, it is also preferable, from the viewpoint of reduction in weight and cost, to provide a core base material with a density in the range of 0.1 to 1.5 as an at least partial interlayer between the layers to form a sandwich structure. The density of the core base material is preferably in the range of 0.15 to 1.45, more preferably in the range of 0.2 to 1.4. It is preferable for the layer of the core base material to contain polyester resins such as polyamide resins, modified phenylene ether resins, polyacetal resins, polyphenylene sulfide resins, liquid crystal polyesters, polyethylene terephthalate, polybutylene terephthalate, and polycyclohexane dimethyl terephthalate; styrene based resins such as polyarylate resins, polycarbonate resins, polystyrene resins, HIPS resins, ABS resins, AES resins, and AAS resins; acrylic resins such as polymethyl methacrylate resin; polyolefin resins such as vinyl chloride, polyethylene, and polypropylene; modified polyolefin resins; and various elastomers such as ethylene/propylene copolymer, ethylene/1-butene copolymer, ethylene/propylene/diene copolymer, ethylene/carbon monoxide/diene copolymer, ethylene/glycidyl(meth)acrylate, ethylene/vinyl acetate/glycidyl(meth)acrylate copolymer, polyether ester elastomer, polyether ether elastomer, polyether ester amide elastomer, polyester amide elastomer, and polyester ester elastomer. In particular, polypropylene based foamed material (foamed polypropylene/ethylene-propylene copolymer, etc.) is preferably used as the core base material layer because it is easy to form thin walls with controlled thicknesses while ensuring light weight.

In the the fiber reinforcing member (b), it is preferable to provide a thermoplastic resin adhesive layer for fixation at the adhesion interface between the base layer, which contains the resin (b1) and the fiber (b2), and the core base material, from the viewpoint of interlaminar peel strength. Useful thermoplastic resins to use in the thermoplastic resin adhesive layer to be disposed at the adhesion interface include acrylic resins; polyolefin resins such as vinyl chloride, polyethylene, and polypropylene; modified polyolefin resins; and various elastomers such as ethylene/propylene copolymer, ethylene/1-butene copolymer, ethylene/propylene/diene copolymer, ethylene/carbon monoxide/diene copolymer, ethylene/glycidyl(meth)acrylate, ethylene/vinyl acetate/glycidyl(meth)acrylate copolymer, polyether ester elastomer, polyether ether elastomer, polyether ester amide elastomer, polyester amide elastomer, and polyester ester elastomer, of which polyolefin resins are preferably used as the thermoplastic resin to form the thermoplastic resin adhesive layer because it is easy to form thin walls with controlled thicknesses.

As described above, it is important for the electronic device housing according to the present invention that the fiber reinforcing member (a) and the fiber reinforcing member (b) are joined directly without the existence of another layer at the joining face between the fiber reinforcing member (a) and the fiber reinforcing member (b) (the region between the fiber reinforcing member (a) and the fiber reinforcing member (b)). Accordingly, it is preferable for the fiber reinforcing member (b) to have a region containing a thermoplastic resin near the interface with the fiber reinforcing member (a). Here, the region containing a thermoplastic resin in the fiber reinforcing member (b) is the area numbered 5 in FIGS. 1 to 3, where the thickness of the area in each diagram is exaggerated to indicate its existence, although the thickness is commonly in the range of 1 to 300 µm and preferably 50 to 150 µm.

It is preferable that a region containing a thermoplastic resin exists at least near either surface of the fiber reinforcing member (b) and that the surface having that region is attached to the fiber reinforcing member (a). This eliminates the necessity of an adhesive layer to be provided between the fiber reinforcing member (b) and the fiber reinforcing member (a) (outside the fiber reinforcing member (b)) when the fiber reinforcing member (a) and the fiber reinforcing member (b) are joined together, allowing the direct joining between the fiber reinforcing member (a) and the fiber reinforcing member (b) to be carried out easily and firmly because the resin (a1) can be melted and integrated with the thermoplastic resin existing in the region containing the thermoplastic resin in the fiber reinforcing member (b). Thus, the region near the surface containing a thermoplastic resin in the fiber reinforcing member (b) as-prepared to use for molding an electronic device housing will be located near the interface with the fiber reinforcing member (a) in the molded electronic device housing. In FIGS. 1 to 3, therefore, the region numbered 5 is located near the interface of the fiber reinforcing member (b) when the fiber reinforcing member (b) is in a molded electronic device housing (only the fiber reinforcing member (b) is shown) whereas the region is located near a surface of the fiber reinforcing member (b) when it is still a member to use for later molding. The latter case is assumed in the paragraph of "Explanation of Numerals" described later.

In the case where the resin (b1) contained in the fiber reinforcing member (b) is a thermoplastic resin that is mutually compatible with the resin (a1), the thermoplastic resin numbered 1 in FIGS. 1 and 2 is not necessary and the effect described above can be realized if the region numbered 5 in FIG. 3 has a thickness in the aforementioned range.

In the case where the resin (b1) contained in the fiber reinforcing member (b) is a thermoplastic resin that is not mutually compatible with the resin (a1) or where it is a thermosetting resin, good examples of thermoplastic resin 1, which exists in the thermoplastic resin-containing region located near at least either surface of the fiber reinforcing member (b), include polyester, polyamide, polyphenylene sulfide, polyimide, polyamide-imide, polyether ketone, polyether ether ketone, polyether ketone ketone, and polyarylate, but it is preferably a thermoplastic resin of the same species as the resin (a1) from the viewpoint of the adhesive strength between the fiber reinforcing member (a) and the fiber reinforcing member (b).

As in the above case, thermoplastic resin 1, which exists in the thermoplastic resin-containing region suitably located near at least either surface of the fiber reinforcing member (b), preferably has an interpenetrating network structure as illustrated in FIGS. 1 and 2. For example, a fiber reinforcing member (b) as given in FIG. 1 and FIG. 2 can be produced by putting a nonwoven fabric base material on the surface of a prepreg sheet used as a material for the fiber reinforcing member (b), followed by subjecting them to compression molding. Such a nonwoven fabric base material can be produced by, for example, the meltblowing technique. Such a structure is preferable from the viewpoint of the adhesive strength between the fiber reinforcing member (a) and the thermoplastic resin existing in the region near the surface of the fiber reinforcing member (b). Here, depending on the conditions for carrying out the compression molding of the nonwoven fabric base material put on the surface of a prepreg sheet, the network-like portion of thermoplastic resin 1 numbered 1, which is derived from the nonwoven fabric, may exist only in a region closer to the surface than the reinforcing fibers as illustrated in FIG. 1 or may be in the form of being partly pressed into the reinforcing fibers as illustrated in FIG. 2.

The electronic device housing according to the present invention is composed mainly of the fiber reinforcing member (a) and the fiber reinforcing member (b), and the projected area of the fiber reinforcing member (a) preferably accounts for 60% or more of the total projected area, which accounts for 100%, of the housing projected onto the plane of the top face. Here, the expression of "being composed mainly of the fiber reinforcing member (a) and the fiber reinforcing member (b)" means that the electronic device housing contains the fiber reinforcing member (a) and the fiber reinforcing member (b) in such a manner as described below and does not mean the exclusion of other members than the fiber reinforcing member (a) and the fiber reinforcing member (b). Here, the plane of the top face means the plane of the outer visible design face of the electronic device. The projected area of the fiber reinforcing member (a) preferably accounts for 70% or more, more preferably 80% or more, of the total projected area, which accounts for 100%, of the housing projected onto the plane of the top face. On the other hand, with respect to the upper limit, the projected area of the fiber reinforcing member (a) preferably accounts for 95% or less of the total projected area, which accounts for 100%, of the housing projected onto the plane of the top face. Meeting such a requirement for projected area is preferable because when the fiber reinforcing member (b) contains non-electrically-conductive fibers, the housing will have a high radio wave transmissivity. There are no specific limitations on the position where the fiber reinforcing member (b) is located, and it may be divided into two or more and disposed at separate positions, or may be disposed on a side face instead of the top face, or may be disposed on both the side face and the top face as long as the projected area of the fiber reinforcing member (a) accounts for 60% or more of the total projected area, which accounts for 100%, of the housing projected onto the plane of the top face. Or, the fiber reinforcing member (b) may be processed into an L-shape so that it extends from the top face to the side face.

On the other hand, the opposite face to the top face of the electronic device housing is the inner face that contains the electronic device, and may be provided with a frame, boss, rib, hinge, and/or runner if it requires complicated shaped portions. For the present invention, it is preferable that the shaped portions of at least one selected from the group of frame, boss, rib, hinge, and runner is formed of the fiber reinforcing member (a).

For the electronic device housing according to the present invention, there are no specific limitations on the method to use for integrating the fiber reinforcing member (a) and the fiber reinforcing member (b), and useful methods include insert molding, heat welding, and ultrasonic welding. However, from the viewpoint of mass productivity and adhesive strength, it is preferable to adopt the insert molding process as the production method for the electronic device housing according to the present invention, which includes a first step for inserting the fiber reinforcing member (b) into a die with a temperature controlled at 100° C. or more and a second step for injecting a resin composition containing a thermoplastic resin (a1) and a fiber (a2) into the inserted fiber reinforcing member (b) existing in the die to form a fiber reinforcing member (a) so that the fiber reinforcing member (a) and the fiber reinforcing member (b) are integrated.

The electronic device housing according to the present invention can maintain the antenna performance without deteriorating the radio communication performance and it is also excellent in the degree of warpage and dimensional accuracy and high in heat resistance. Accordingly, it can be suitably used as housings for electronic devices that perform radio communications with external devices and such electronic devices include notebook computers, portable telephones, smartphones, digital cameras, digital video cameras, PDA's, liquid crystal displays, plasma displays, telephones, facsimiles, video recorders, DVD recorders, hard disk recorders, other image recorders, copying machines, TV sets, game machines, cameras, clocks, X-ray cassettes, and other medical care devices.

EXAMPLES

The present invention is described in more detail below with reference to examples. It should be noted that the present invention should not be construed as limited to the examples.

[Evaluation Methods]

First, the evaluation methods used for the present invention are described below.

1. Low Degree of Warpage

In each Example and Comparative example, five molded housings (N=5) were produced and left on a horizontal table in an atmosphere of 23° C. and a humidity of 50%. While three of the four corners of a molded housing were maintained in contact with the horizontal table, the height (distance from the horizontal table) of the fourth corner was measured, and the arithmetic average of the five measurements (N=5) was adopted as the degree of warpage. It is 0 mm if the four corners were in contact with the horizontal table, and a smaller distance indicates a smaller degree of warpage.

2. Dimensional Accuracy

In each Example and Comparative example, five molded housings (N=5) were produced and the shrinkage rate in the length direction of each molded housing was calculated by the equation given below. The arithmetic average of the molding shrinkage calculations was adopted as their dimensional accuracy.

$$\text{Shrinkage rate (\%)} = \{(\text{length of die} - \text{length of molded sample})/\text{length of die}\} \times 100$$

3. Warping Deformation in High Temperature Treatment

In each Example and Comparative example, five molded housings (N=5) were produced and subjected to heat treatment at 100° C. for 2 hours, which simulated heat generation from an electronic device. Then, the molded housings were cooled to room temperature and left on a horizontal table in an atmosphere at 23° C. and a humidity of 50%. While three of the four corners of each molded housing were maintained in contact with the horizontal table, the height (distance from the horizontal table) of the fourth corner was measured, and the arithmetic average of the five measurements (N=5) was calculated as in the previous case to determine the degree of warpage of heat-treated housings. A smaller degree of warpage indicates a smaller liability to thermal influence and a higher heat resistance.

4. Linear Expansion Coefficient of Fiber Reinforcing Member

In each Example and Comparative example, five molded housings (N=5) were produced, and the fiber reinforcing member (a) and the fiber reinforcing member (b) were cut out in the length direction and the width direction of the electronic device housing to provide strip-shaped test pieces, each having a length of 10 mm and a width of 4 mm. After polishing the end faces to make them smooth, each test piece was heated using TMA-100, manufactured by Seiko Electronics industrial Co., Ltd., according to JIS K7197 (2012), from 0° C. to 200° C. at a heating rate of 5° C./min to determine the linear expansion coefficient in the range of 30° C. to 150° C., followed by calculating the arithmetic average of all measurements (for the purposes of the present description, the linear expansion coefficient is represented in ppm/° C., and 1 ppm/° C. is assumed to be equal to $1 \times 10^{-6}/°$ C.).

5. Bending Elastic Modulus of Fiber Reinforcing Member

In each Example and Comparative example, five molded housings (N=5) were produced, and the fiber reinforcing member (a) and the fiber reinforcing member (b) were cut out to provide strip-shaped test pieces, each having a length of 80 mm and a width of 10 mm, which were subjected to bending test at 23° C. according to JIS K7171 (2008) to determine the bending elastic modulus. From the bending elastic modulus A2 of the fiber reinforcing member (a) and the bending elastic modulus B2 of the fiber reinforcing member (b), the ratio of bending elastic modulus was calculated as A2/B2.

6. Average Fiber Length of Fiber (a2) in Electronic Device Housing

To prepare a test piece, a sample with a length of 10 mm and a width of 10 mm was cut out of the fiber reinforcing member (a) of an electronic device housing. This test piece was immersed in 1-chloronaphthalene, and heated at 300° C. to dissolve the resin component. After dissolving the resin component, the test piece was observed by microscopy at a magnification of 100, and 400 fibers were selected randomly from the field of view, followed by measuring their fiber lengths. From the measured length Li of each fiber, the number average fiber length Ln and the mass average fiber length Lw were calculated by the following equations.

Number average fiber length $Ln=(\Sigma Li)/(N)$

Here, N is the number of fibers observed (400).

Mass average fiber length $Lw=(\Sigma Li2)/(\Sigma Li)$

[Resin (a1)]

The resins used as the resin (a1) in Examples and Comparative examples are described below.

(a1-1)

An acid-terminated product of polyphenylene sulfide with a melting point of 285° C., a mass average molecular weight of 30,000, and a chloroform extraction of 0.5 mass %.

(a1-2)

An acid-terminated product of polyphenylene sulfide with a melting point of 285° C., a mass average molecular weight of 40,000, and a chloroform extraction of 0.5 mass %.

[Fiber (a2)]

The fibers used as the fiber (a2) in Examples and Comparative examples are described below.

(a2-1)

A copolymer containing polyacrylonitrile as primary component was spun, calcined, and subjected to surface oxidation treatment to produce a continuous carbon fiber strand composed of a total of 12,000 single yarns. This carbon fiber had characteristics as follows: tensile strength of 4,900 MPa, tensile modulus of 240 GPa, tensile elongation of 2%, specific gravity of 1.8, single yarn diameter of 7 μm, and surface oxygen concentration ratio [O/C] of 0.12.

(a2-2)

A copolymer containing polyacrylonitrile as primary component was spun, calcined, and subjected to surface oxidation treatment to produce a continuous carbon fiber strand composed of a total of 24,000 single yarns. This carbon fiber had characteristics as follows: tensile strength of 5,900 MPa, tensile modulus of 290 GPa, tensile elongation of 2%, specific gravity of 1.8, and surface oxygen concentration ratio [O/C] of 0.06.

Example 1

A fiber bundle of the fiber (a2-1) was taken up continuously, immersed in a water-based sizing mother liquid containing 2 mass % of bisphenol A type epoxy resin jER828 (manufactured by Mitsubishi Chemical Corporation), and dried by heating at 230° C. to produce a fiber (a2-1) surface-treated with bisphenol A type epoxy resin jER828. After the drying step, the deposited bisphenol A type epoxy resin jER828 accounted for 1 part by mass relative to the fiber (a2-1), which accounted for 100 parts by mass.

A melt of bisphenol A type epoxy resin jER1003 (manufactured by Mitsubishi Chemical Corporation) (mass average molecular weight 1,300, mass average molecular weight divided by the total number of carboxyl groups, amino groups, hydroxyl groups, and epoxy groups contained in one molecule is 240) was obtained in a melting bath at 250° C. The melt obtained was supplied to a kiss coater by a gear pump and discharged from the kiss coater onto a roller heated at 250° C. to form a film of bisphenol A type epoxy resin jER1003.

The surface-treated fiber (a2-1) obtained previously was fed to travel in contact with the roller coated with the film of bisphenol A type epoxy resin jER1003 formed above to deposit bisphenol A type epoxy resin jER1003 at an appropriate rate per unit length of the reinforcing fiber bundle of the fiber (a2-1).

The fiber (a2-1) carrying deposited bisphenol A type epoxy resin jER1003 was supplied into a furnace heated at 260° C. and passed between 10 roll bars (diameter 50 mm) rotating freely on bearings and located alternately above and below a straight line to allow the surface-treated fiber (a2-1) to be impregnated with the bisphenol A type epoxy resin jER1003, thus providing a composite material consisting of the fiber (a2-1) and the bisphenol A type epoxy resin.

Subsequently, a mixture was prepared by adding 5 parts by mass of aliphatic polycarbodiimide Carbodilite (registered trademark) HMV-8CA (manufactured by Nisshinbo Chemical Inc.) (carbodiimide group equivalent 278, mass average molecular weight 3,000) to 100 parts by mass of the resin (a1-1) and melted in a single screw extruder at 300° C., and the resulting resin composition was extruded into a crosshead die mounted at the end of the single screw extruder while at the same time continuously supplying the composite material together into the crosshead die to produce a strand composed of the composite material clad with the resin composition. Here, the take-up speed of the strand was adjusted to 10 m/min and the material supply rate was controlled so that the composite material accounted for 30 parts by mass relative to 100 parts by mass of the resin composition.

The strand was cooled and cut with a cutter into pieces with a length of 7 mm to provide pellets to be used as material for (a)-1, which was intended to serve as the fiber reinforcing member (a) for the present invention. Each of these pellets has a core-sheath structure composed of the composite material as the core and the resin composition surrounding the composite material.

The pellets were produced continuously on-line. The pellets obtained were free of fuzzing due to conveyance and high in handleability.

Subsequently, a stack of five 30 cm×30 cm prepreg sheets cut out of prepreg sheet SCF183 EP-BL3 manufactured by Super Resin, Inc., which contains an epoxy resin as the resin (b1) and a continuous glass fiber as the fiber (b2), was prepared.

A nonwoven fabric base material (density 1.34 g/cm$^3$, monofilament diameter 7.8 μm, melting point 278° C., mass per unit area 40 g/m$^2$, tensile strength 50 MPa, linear expansion coefficient 75×10$^{-6}$/° C., thickness 0.2 mm, air permeability 100 cm$^3$/cm$^2$·S) was prepared by meltblowing from pellets of polyphenylene sulfide resin Torelina M2888 manufactured by Toray Industries, Inc. and put on the aforementioned stack of five prepreg sheets to provide a layered body. This layered body was held in a planar die and pressed in a press molding machine set in such a manner as to maintain a heating platen temperature of 150° C. and a molding pressure of 1.0 MPa. Then, 30 minutes later, it was taken out of the die to provide a planar molding (b)-1. A 20 cm×5 cm portion was cut out of the resulting planar molding (b)-1 and used as the fiber reinforcing member (b).

Subsequently, the fiber reinforcing member (b) was inserted into a die and injection molding of the aforementioned pellets was carried out using an injection molding machine (J150EII-P, manufactured by JSW) to provide an A4-size molded housing (thickness 1.2 mm). This injection molding was performed at a cylinder temperature of 320° C. and a die temperature of 150° C., and the maximum pressure during the injection molding step was adopted as the injection molding pressure.

Characteristics of the molded housing obtained are shown in Table 1.

The projected area of the fiber reinforcing member (a) accounted for 84% at the plane of the top face of the resulting molded housing, and the fiber (a2) had a mass average fiber length Lw of 0.9 mm and a ratio Lw/Ln between the mass average fiber length Lw and the number average fiber length Ln of 1.5. The fiber reinforcing member (a) had a linear expansion coefficient A1 of 10 ppm/° C., and the fiber reinforcing member (b) had a linear expansion coefficient B1 of 12 ppm/° C., giving an A1/B1 ratio of 0.83. The fiber reinforcing member (a) had a bending elastic modulus A2 of 25.5 GPa, and the fiber reinforcing member (b) had a bending elastic modulus B2 of 22.4 GPa, giving an A2/B2 ratio of 1.1. The resulting molded housing had a degree of warpage of 0.2 mm, a molding shrinkage rate of 0.1%, and a degree of warpage after high temperature treatment of 0.4 mm, showing that the housing was excellent in terms of the degree of warpage and dimensional accuracy and small in deformation after high temperature treatment.

Example 2

Except that pellets prepared as described below were used as material for (a)-2, which was used as the fiber reinforcing member (a), the same procedure as in Example 1 was carried out to provide an A4-size molded housing.

A fiber bundle of the fiber (a2-1) was taken up continuously, immersed in a water-based sizing mother liquid containing 2 mass % of bisphenol A type epoxy resin jER828 (manufactured by Mitsubishi Chemical Corporation), and dried by heating at 230° C. to produce a fiber (a2-1) surface-treated with bisphenol A type epoxy resin jER828. After the drying step, the deposited bisphenol A type epoxy resin jER828 accounted for 1 part by mass relative to the fiber (a2-1), which accounted for 100 parts by mass. Subsequently, the surface-treated fiber (a2-1) was cut into pieces with a length of 6 mm to produce chopped strands, and melt-kneading was performed in a twin screw extruder (TEX-30α, manufactured by JSW, L/D=31.5) while supplying 95 parts by mass of the resin (a1-1) and 5 parts by mass of aliphatic polycarbodiimide Carbodilite (registered trademark) HMV-8CA (manufactured by Nisshinbo Chemical Inc.) as main feed and supplying 30 parts by mass of the chopped strand as side feed. The melt-kneading was performed at a cylinder temperature of 290° C., a screw rotating speed of 150 rpm, and a discharge rate of 10 kg/hour, and the discharged material was cooled in a water bath as it was taken up to prepare a gut, followed by cutting the gut to a length of 5 mm to provide pellets.

Characteristics of the molded housing obtained are shown in Table 1.

The projected area of the fiber reinforcing member (a) accounted for 84% at the plane of the top face of the resulting molded housing, and the fiber (a2) had a mass average fiber length Lw of 0.2 mm and a ratio Lw/Ln between the mass average fiber length Lw and the number average fiber length Ln of 2.0. The fiber reinforcing member (a) had a linear expansion coefficient A1 of 20 ppm/° C., and the fiber reinforcing member (b) had a linear expansion coefficient B1 of 12 ppm/° C., giving an A1/B1 ratio of 1.67. The fiber reinforcing member (a) had a bending elastic modulus A2 of 17.8 GPa, and the fiber reinforcing member (b) had a bending elastic modulus B2 of 22.4 GPa, giving an A2/B2 ratio of 0.79. The resulting molded housing had a degree of warpage of 0.3 mm, a molding shrinkage rate of 0.6%, and a degree of warpage after high temperature treatment of 0.5 mm, showing that the housing was excellent in terms of the degree of warpage and dimensional accuracy and small in deformation after high temperature treatment.

Comparative Example 1

Except that a member prepared as described below was used as material for (b)-2, which was used as the fiber reinforcing member (b), the same procedure as in Example 1 was carried out to provide an A4-size molded housing.

In a twin screw extruder (TEX-30a, manufactured by JSW, L/D=31.5), acid-terminated polyphenylene sulfide with a melting point of 285° C., a mass average molecular weight of 30,000, and a chloroform extraction of 0.5 mass % was supplied as main feed whereas glass fiber ECS03T-747H with an average fiber diameter of 10.5 μm (chopped strand, manufactured by Nippon Electric Glass Co., Ltd.) was supplied as side feed, and they were melt-kneaded while controlling their feed rates in such a manner that the side feed accounted for 45 parts by mass relative to 100 parts by mass of the main feed. The melt-kneading was performed at a cylinder temperature of 300° C., a screw rotating speed of 150 rpm, and a discharge rate of 10 kg/hour, and the discharged material was cooled in a water bath as it was taken up to prepare a gut, followed by cutting the gut to a length of 5 mm to provide pellets. The resulting pellets were molded in an injection molding machine (J150EII-P, manufactured by JSW) at a cylinder temperature of 320° C. and a die temperature of 150° C. to prepare a strip-shaped fiber reinforcing member (b)-2 with a size of 20 cm×5 cm×1 mm (thickness).

Characteristics of the molded housing obtained are shown in Table 1.

The projected area of the fiber reinforcing member (a) accounted for 84% at the plane of the top face of the resulting molded housing, and the fiber (a2) had a mass average fiber length Lw of 0.9 mm and a ratio Lw/Ln between the mass average fiber length Lw and the number average fiber length Ln of 1.5. The fiber reinforcing member (a) had a linear expansion coefficient A1 of 10 ppm/° C., and the fiber reinforcing member (b) had a linear expansion coefficient B1 of 30 ppm/° C., giving an A1/B1 ratio of 0.33. The fiber reinforcing member (a) had a bending elastic modulus A2 of 25.5 GPa, and the fiber reinforcing member (b) had a bending elastic modulus B2 of 11.5 GPa, giving an A2/B2 ratio of 2.2. The resulting molded housing had a degree of warpage of 0.9 mm, a molding shrinkage rate of 1.4%, and a degree of warpage after high temperature treatment of 1.6 mm.

Comparative Example 2

Except that a member prepared as described below was used as material for (b)-3, which was used as the fiber reinforcing member (b), the same procedure as in Example 1 was carried out to provide an A4-size molded housing.

Prepreg P3052S-12 formed of Torayca (registered trademark) manufactured by Toray Industries, Inc., in which the resin (b1) was an epoxy resin and the fiber (b2) was a continuous carbon fiber, was cut into sheets with a size of 30 cm×30 cm, and six of the prepreg sheets were stacked in such a manner that the fiber directions were 0°, 90°, 0°, 0°, 90°, and 0° in the top to the bottom sheets, respectively. A nonwoven fabric base material (density 1.34 g/cm³, monofilament diameter 7.8 μm, melting point 278° C., mass per unit area 40 g/m², tensile strength 50 MPa, linear expansion coefficient 75×10$^{-6}$/° C., thickness 0.2 mm, air permeability 100 cm³/cm²·S) was prepared by meltblowing from pellets of polyphenylene sulfide resin Torelina M2888 manufactured by Toray Industries, Inc. and put on the aforementioned stack of six prepreg sheets to provide a layered body. The layered body was held in a planar die and pressed in a press molding machine set in such a manner as to maintain a heating platen temperature of 150° C. and a molding pressure of 1.0 MPa. Then, 30 minutes later, it was taken out of the die to provide a planar molding (b)-3. A 20 cm×5 cm portion was cut out of the resulting planar molding (b)-3 and used as the fiber reinforcing member (b).

Characteristics of the molded housing obtained are shown in Table 2. The projected area of the fiber reinforcing member (a) accounted for 84% at the plane of the top face of the resulting molded housing, and the fiber (a2) had a mass average fiber length Lw of 0.9 mm and a ratio Lw/Ln between the mass average fiber length Lw and the number average fiber length Ln of 1.5. The fiber reinforcing member (a) had a bending elastic modulus A2 of 25.5 GPa, and the fiber reinforcing member (b) had a bending elastic modulus B2 of 55 GPa, giving an A2/B2 ratio of 0.46. The resulting molded housing had a degree of warpage of 0.3 mm, a molding shrinkage rate of 0.2%, and a degree of warpage after heat treatment of 1.2 mm.

Comparative Example 3

Except that pellets prepared as described below were used as material for (a)-3, which was used as the fiber reinforcing member (a), the same procedure as in Comparative example 2 was carried out to provide an A4-size molded housing.

In a twin screw extruder (TEX-30a, manufactured by JSW, L/D=31.5), acid-terminated polyphenylene sulfide with a melting point of 285° C., a mass average molecular weight of 30,000, and a chloroform extraction of 0.5 mass % was supplied as main feed whereas glass fiber ECS03T-747H with an average fiber diameter of 10.5 μm (chopped strand, manufactured by Nippon Electric Glass Co., Ltd.) was supplied as side feed, and they were melt-kneaded while controlling their feed rates in such a manner that the side feed accounted for 45 parts by mass relative to 100 parts by mass of the main feed. The melt-kneading was performed at a cylinder temperature of 300° C., a screw rotating speed of 150 rpm, and a discharge rate of 10 kg/hour, and the discharged material was cooled in a water bath as it is taken up to prepare a gut, followed by cutting the gut to a length of 5 mm to provide pellets to be used as material for (a)-3, which was intended to serve as the fiber reinforcing member (a).

Characteristics of the molded housing obtained are shown in Table 2. The projected area of the fiber reinforcing member (a) accounted for 84% at the plane of the top face of the resulting molded housing, and the fiber (a2) had a mass average fiber length Lw of 0.3 mm and a ratio Lw/Ln between the mass average fiber length Lw and the number average fiber length Ln of 1.8. The fiber reinforcing member (a) had a linear expansion coefficient A1 of 30 ppm/° C. and the fiber reinforcing member (b) had a linear expansion coefficient B1 of 3 ppm/° C., giving an A1/B1 ratio of 10.0. The resulting molded housing had a degree of warpage of 1.4 mm, a molding shrinkage rate of 0.6%, and a degree of warpage after heat treatment of 1.4 mm.

Example 3

Except that the fiber reinforcing member (b) inserted in the injection molding die had a size of 20 cm×3 cm, the same procedure as in Example 1 was carried out to provide an A4-size molded housing. Characteristics of the molded housing obtained are shown in Table 3.

Example 4

Except that the fiber reinforcing member (b) inserted in the injection molding die had a size of 20 cm×13 cm, the same procedure as in Example 1 was carried out to provide an A4-size molded housing. Characteristics of the molded housing obtained are shown in Table 3.

Example 5

Except that pellets prepared as described below were used as material for (a)-4, which was used as the fiber reinforcing member (a), the same procedure as in Example 1 was carried out to provide an A4-size molded housing.

A fiber bundle of the fiber (a2-2) was taken up continuously, immersed in a water-based sizing mother liquid containing 2 mass % of bisphenol A type epoxy resin jER828 (manufactured by Mitsubishi Chemical Corporation), and dried by heating at 230° C. to produce a fiber (a2-2) surface-treated with bisphenol A type epoxy resin jER828. After the drying step, the deposited bisphenol A type epoxy resin jER828 accounted for 1 part by mass relative to 100 parts by mass of the fiber (a2-2).

A melt of bisphenol A type epoxy resin jER1003 (manufactured by Mitsubishi Chemical Corporation) (mass average molecular weight 1,300, mass average molecular weight divided by the total number of carboxyl groups, amino groups, hydroxyl groups, and epoxy groups contained in one molecule is 240) was obtained in a melting bath at 250° C. The melt obtained was supplied to a kiss coater by a gear pump and discharged from the kiss coater onto a roller heated at 250° C. to form a film of bisphenol A type epoxy resin jER1003.

The surface-treated fiber (a2-2) obtained previously was fed to travel in contact with the roller coated with the film of bisphenol A type epoxy resin jER1003 formed above to deposit bisphenol A type epoxy resin jER1003 at an appropriate rate per unit length of the reinforcing fiber bundle of the fiber (a2-2).

The fiber (a2-2) carrying deposited bisphenol A type epoxy resin jER1003 was supplied into a furnace heated at 260° C. and passed between 10 roll bars (diameter 50 mm) rotating freely on bearings and located alternately above and below a straight line to allow the surface-treated fiber (a2-2) to be impregnated with the bisphenol A type epoxy resin jER1003, thus providing a composite material consisting of the fiber (a2-2) and the bisphenol A type epoxy resin.

Subsequently, the resin (a1-2) was melted in a single screw extruder at 300° C., and the resulting resin composition was extruded into a crosshead die mounted at the end of the single screw extruder while at the same time continuously supplying the composite material into the crosshead die to produce a strand composed of the composite material clad with the resin (a1-2). Here, the take-up speed of the strand was adjusted to 10 m/min and the material supply rate was controlled so that the composite material accounted for 20 parts by mass relative to 100 parts by mass of the resin (a1-2).

The strand was cooled and cut with a cutter into pieces with a length of 7 mm to provide pellets to be used as material for (a)-4, which was intended to serve as the fiber reinforcing member (a) for the present invention. Each of these pellets has a core-sheath structure composed of the composite material as the core and the resin (a1-2) surrounding the composite material.

The pellets were produced continuously on-line. The pellets obtained were free of fuzzing due to conveyance and high in handleability. Characteristics of the molded housing obtained are shown in Table 3.

Comparative Example 4

Except for using (a)-4 instead of (a)-1 as the fiber reinforcing member (a), the same procedure as in Comparative example 1 was carried out to provide an A4-size molded housing. Characteristics of the molded housing obtained are shown in Table 3.

Comparison between the results in Examples and those in Comparative examples clearly indicates that the electronic device housings prepared according to embodiments of the present invention realized uniform characteristics when integrating the fiber reinforcing member (a) and the fiber reinforcing member (b), showed high resistance to strain and deformation in molding and use environments to ensure a low degree of warpage and a high dimensional accuracy, and suffered little deformation in high temperature environments.

TABLE 1

|  |  | Example 1 | Example 2 | Comparative example 1 |
|---|---|---|---|---|
| Fiber reinforcing member (a) | — | (a)-1 | (a)-2 | (a)-1 |
| Fiber reinforcing member (b) | — | (b)-1 | (b)-1 | (b)-2 |
| Size of fiber reinforcing member (b) | cm × cm | 20 × 5 | 20 × 5 | 20 × 5 |
| Project area of fiber reinforcing member (a) | % | 84 | 84 | 84 |
| Linear expansion coefficient (A1) of fiber reinforcing member (a) | ppm/° C. | 10 | 20 | 10 |
| Linear expansion coefficient (B1) of fiber reinforcing member (b) | ppm/° C. | 12 | 12 | 30 |
| Ratio (A1/B1) in linear expansion coefficient | — | 0.83 | 1.67 | 0.33 |
| Bending elastic modulus (A2) of fiber reinforcing member (a) | GPa | 25.5 | 17.8 | 25.5 |
| Bending elastic modulus (B2) of fiber reinforcing member (b) | GPa | 22.4 | 22.4 | 11.5 |
| Ratio (A2/B2) in bending elastic modulus | — | 1.1 | 0.79 | 2.2 |
| Mass average fiber length Lw of fiber (a2) | mm | 0.9 | 0.2 | 0.9 |
| Ratio (Lw/Ln) between mass average fiber length and number average fiber length | — | 1.5 | 2 | 1.5 |
| Warp of molded housing (liability to warpage) | mm | 0.2 | 0.3 | 0.9 |
| Molding shrinkage rate | % | 0.1 | 0.6 | 1.4 |
| Warp after high temperature treatment (heat resistance) | mm | 0.4 | 0.5 | 1.6 |

TABLE 2

|  |  | Comparative example 2 | Comparative example 3 |
|---|---|---|---|
| Fiber reinforcing member (a) | — | (a)-1 | (a)-3 |
| Fiber reinforcing member (b) | — | (b)-3 | (b)-3 |
| Size of fiber reinforcing member (b) | cm × cm | 20 × 5 | 20 × 5 |
| Project area of fiber reinforcing member (a) | % | 84 | 84 |
| Linear expansion coefficient (A1) of fiber reinforcing member (a) | ppm/° C. | 10 | 30 |
| Linear expansion coefficient (B1) of fiber reinforcing member (b) | ppm/° C. | 3 | 3 |
| Ratio (A1/B1) in linear expansion coefficient | — | 3.33 | 10 |
| Bending elastic modulus (A2) of fiber reinforcing member (a) | GPa | 25.5 | 11.5 |
| Bending elastic modulus (B2) of fiber reinforcing member (b) | GPa | 55 | 55 |
| Ratio (A2/B2) in bending elastic modulus | — | 0.46 | 0.21 |
| Mass average fiber length Lw of fiber (a2) | mm | 0.9 | 0.3 |
| Ratio (Lw/Ln) between mass average fiber length and number average fiber length | — | 1.5 | 1.8 |
| Warp of molded housing (liability to warpage) | mm | 0.3 | 1.4 |

TABLE 2-continued

|  |  | Comparative example 2 | Comparative example 3 |
|---|---|---|---|
| Molding shrinkage rate | % | 0.2 | 0.6 |
| Warp after high temperature treatment (heat resistance) | mm | 1.2 | 1.4 |

TABLE 3

|  |  | Example 3 | Example 4 | Example 5 | Comparative example 4 |
|---|---|---|---|---|---|
| Fiber reinforcing member (a) | — | (a)-1 | (a)-1 | (a)-4 | (a)-4 |
| Fiber reinforcing member (b) | — | (b)-1 | (b)-1 | (b)-1 | (b)-2 |
| Size of fiber reinforcing member (b) | cm × cm | 20 × 3 | 20 × 13 | 20 × 5 | 20 × 5 |
| Project area of fiber reinforcing member (a) | % | 91 | 59 | 84 | 84 |
| Linear expansion coefficient (A1) of fiber reinforcing member (a) | ppm/° C. | 10 | 10 | 13 | 13 |
| Linear expansion coefficient (B1) of fiber reinforcing member (b) | ppm/° C. | 12 | 12 | 12 | 30 |
| Ratio (A1/B1) in linear expansion coefficient | — | 0.83 | 0.83 | 1.08 | 0.43 |
| Bending elastic modulus (A2) of fiber reinforcing member (a) | GPa | 25.5 | 25.5 | 18.5 | 18.5 |
| Bending elastic modulus (B2) of fiber reinforcing member (b) | GPa | 22.4 | 22.4 | 22.4 | 11.5 |
| Ratio (A2/B2) in bending elastic modulus | — | 1.1 | 1.1 | 0.82 | 1.61 |
| Mass average fiber length Lw of fiber (a2) | mm | 0.9 | 0.9 | 0.5 | 0.5 |
| Ratio (Lw/Ln) between mass average fiber length and number average fiber length | — | 1.5 | 1.5 | 1.8 | 1.8 |
| Warp of molded housing (liability to warpage) | mm | 0.2 | 0.7 | 0.3 | 0.9 |
| Molding shrinkage rate | % | 0.1 | 0.1 | 0.2 | 1.5 |
| Warp after high temperature treatment (heat resistance) | mm | 0.5 | 1.1 | 0.5 | 1.8 |

INDUSTRIAL APPLICABILITY

The present invention can provide a useful electronic device housing that is able to maintain the antenna performance without deteriorating the radio communication performance, maintain uniformity as a molded electronic device housing constituted of a plurality of members, showed high resistance to strain and deformation in molding and use environments to ensure a low degree of warpage and a high dimensional accuracy, and suffered little deformation in high temperature environments to ensure high mass productivity.

EXPLANATION OF NUMERALS

1. Thermoplastic resin contained in the region numbered 5 in the case where the resin (b1) is a thermosetting resin
2. Resin (b1)
3. Fiber (b2)
4. Base layer composed mainly of resin (b1) and fiber (b2)
5. Region containing thermoplastic resin located near the surface of the fiber reinforcing member (b)
6. Resin (b1) in the case where the resin (b1) is a thermoplastic resin

The invention claimed is:

1. An electronic device housing comprising a fiber reinforcing member (a) and a fiber reinforcing member (b), wherein the fiber reinforcing member (a) contains a resin (a1) and discontinuous fibers (a2) that are electrically conductive, the fiber reinforcing member (b) contains a resin (b1) and continuous fibers (b2) that are not electrically conductive, but does not contain any electrically conductive fibers, the fiber reinforcing member (a) and the fiber reinforcing member (b) are joined directly without the existence of another layer at a joining face between the fiber reinforcing member (a) and the fiber reinforcing member (b), and the fiber reinforcing members (a) and (b) satisfy equation (1) and/or equation (2):

$$0.5 < A1/B1 < 3 \qquad \text{equation (1)}$$

A1 being a linear expansion coefficient of the fiber reinforcing member (a), and
B1 being a linear expansion coefficient of the fiber reinforcing member (b), $$0.7 < A2/B2 < 1.2 \qquad \text{equation (2)}$$

A2 being a bending elastic modulus of the fiber reinforcing member (a), and
B2 being a bending elastic modulus of the fiber reinforcing member (b), and wherein the fiber reinforcing member (a) has a projected area that accounts for 80% or more and 95% or less of a total projected area and the fiber reinforcing member (b) has a projected area that accounts for at least a part of the remainder of the total projected area so as to allow for radio wave transmissivity, wherein the total projected area accounts for 100% of the electronic device housing projected onto a plane of a top face of the electronic device housing such that the electronic device housing will exhibit radio wave transmissivity.

2. The electronic device housing as set forth in claim 1, wherein the resin (b1) is a thermosetting resin.

3. The electronic device housing as set forth in claim 1, wherein the fiber (a2) has a mass average fiber length Lw of 0.4 mm or more and a ratio Lw/Ln of 1.3 to 2.0 between the mass average fiber length Lw and a number average fiber length Ln of the fiber (a2).

4. The electronic device housing as set forth in claim 1, wherein a shaped portion of at least one selected from a frame, boss, rib, hinge, or runner is formed of the fiber reinforcing member (a).

\* \* \* \* \*